(12) United States Patent
Itoh et al.

(10) Patent No.: US 8,440,481 B2
(45) Date of Patent: May 14, 2013

(54) MANUFACTURING METHOD OF THE ELECTRONIC COMPONENT

(75) Inventors: Masayuki Itoh, Kawasaki (JP); Takao Ishikawa, Kawasaki (JP); Tomokazu Nakashima, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/313,908

(22) Filed: Dec. 7, 2011

(65) Prior Publication Data

US 2012/0088335 A1    Apr. 12, 2012

Related U.S. Application Data

(62) Division of application No. 11/892,139, filed on Aug. 20, 2007, now Pat. No. 8,093,616.

(30) Foreign Application Priority Data

Nov. 29, 2006    (JP) .................................. 2006-322460

(51) Int. Cl.
*H01L 21/00* (2006.01)

(52) U.S. Cl.
USPC ............... 438/29; 257/99; 257/100; 257/787; 438/26; 438/27; 438/28

(58) Field of Classification Search ............... 438/26, 438/30, 29, 27, 28; 257/99, 100, 787
See application file for complete search history.

(56) References Cited

U.S. PATENT DOCUMENTS

| 4,012,833 A | 3/1977 | Akiyama |
| 4,024,627 A | 5/1977 | Stauffer |
| 5,917,202 A | 6/1999 | Haitz et al. |
| 6,252,252 B1 | 6/2001 | Kunii et al. |
| 6,773,943 B2 | 8/2004 | Oohata et al. |
| 6,833,566 B2 | 12/2004 | Suehiro et al. |
| 6,886,962 B2 | 5/2005 | Suehiro |
| 7,161,187 B2 | 1/2007 | Suehiro et al. |
| 7,193,303 B2 | 3/2007 | Wu |
| 2005/0104205 A1 | 5/2005 | Wang |
| 2005/0162866 A1 | 7/2005 | Osawa |
| 2006/0007979 A1 | 1/2006 | Jikutani et al. |

FOREIGN PATENT DOCUMENTS

| JP | 53-26870 | 3/1978 |
| JP | 3-39863 | 4/1991 |
| JP | 05-129711 | 5/1993 |
| JP | 08-186326 | 7/1996 |

(Continued)

OTHER PUBLICATIONS

Office Action (Notice of Reasons for Rejection), mailed Oct. 25, 2011 in corresponding Japanese Patent Application No. 2006-322460.

(Continued)

*Primary Examiner* — Kimberly Rizkallah
*Assistant Examiner* — Errol Fernandes
(74) *Attorney, Agent, or Firm* — Staas & Halsey LLP

(57) ABSTRACT

Manufacturing method of an electronic component including connecting one lead of a pair of leads to a surface parallel with a pn connection layer of an electronic element having a structure where the p-type layer and the n-type layer are connected by the pn connection layer provided between the p-type layer and the n-type layer, connecting another lead to another surface parallel with the pn connection layer; and forming a supporting part of the pair of the leads that is connected to and supporting the electronic element, and an electrode part functioning as an electrode, by bending the pair of the leads to an outside.

1 Claim, 10 Drawing Sheets

FOREIGN PATENT DOCUMENTS

| | | |
|---|---|---|
| JP | 9-205264 | 8/1997 |
| JP | 10-242519 | 9/1998 |
| JP | 2002-158465 | 5/2002 |
| JP | 2003-115204 | 4/2003 |
| JP | 2006-310887 | 11/2006 |
| KR | 10-0646569 | 11/2006 |

OTHER PUBLICATIONS

English Abstract of JP9205264, Published Aug. 5, 1997.
Patent Abstracts of Japan, Publication No. 08-186326, Published Jul. 16, 1996.
Patent Abstracts of Japan, Publication No. 05-129711, Published May 25, 1993.
Patent Abstracts of Japan, Publication No. 2006-310887, Published Nov. 9, 2006.
Patent Abstracts of Japan, Publication No. 10-242519, Published Sep. 11, 1998.
Patent Abstracts of Japan, Publication No. 10-0646569, Published Nov. 8, 2006.
Nov. 28, 2011 Communication in co-pending U.S. Appl. No. 11/892,139.
Oct. 7, 2011 Notice of Allowance in co-pending U.S. Appl. No. 11/892,139.
May 2, 2011 Final Office Action in co-pending U.S. Appl. No. 11/892,139.
Jan. 11, 2011 Office Action in co-pending U.S. Appl. No. 11/892,139.
Oct. 22, 2010 Restriction Requirement Office Action in co-pending U.S. Appl. No. 11/892,139.
Jul. 1, 2010 Advisory Action in co-pending U.S. Appl. No. 11/892,139.
Feb. 24, 2010 Final Office Action in co-pending U.S. Appl. No. 11/892,139.
Jul. 9, 2009 Office Action in co-pending U.S. Appl. No. 11/892,139.
Chinese Office Action issued on Oct. 17, 2008 in a corresponding Chinese Patent Application No. 200710154432.8.
Korean Office Action issued May 7, 2009 in corresponding Korean Patent Application No. 10-2007-0092574.
Korean Office Action issued Nov. 27, 2009 in corresponding Korean Patent Application No. 10-2007-0092574.
U.S. Appl. No. 11/892,139, filed Aug. 20, 2007, Masayuki Itoh et al., Fujitsu Limited.
Patent Abstracts of Japan, Publication No. 2002-158465, published May 31, 2002.
Japanese Office Action issued Jun. 5, 2012 in corresponding Japanese Patent Application No. 2006-322460.

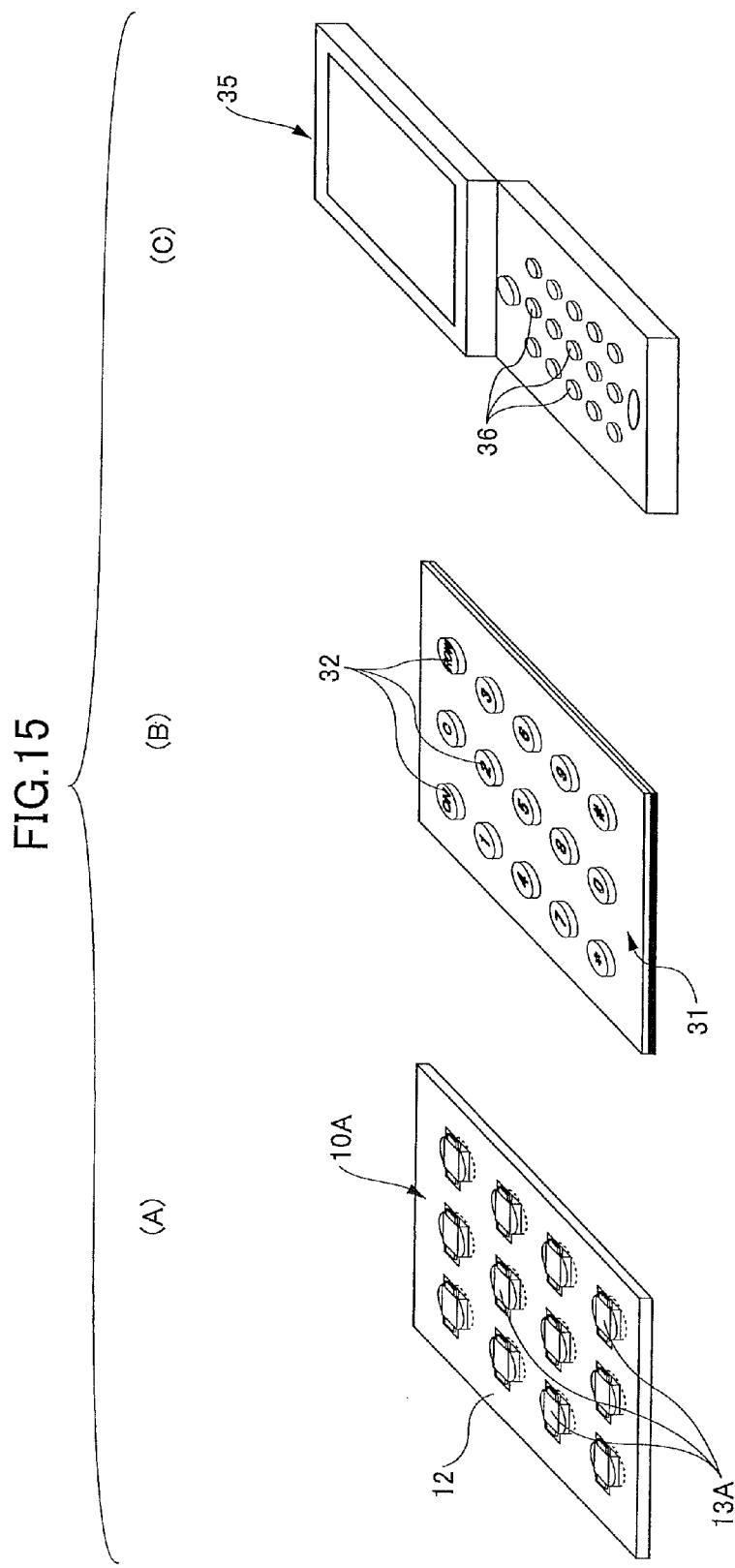

MANUFACTURING METHOD OF THE ELECTRONIC COMPONENT

CROSS REFERENCE TO RELATED APPLICATIONS

This application is a divisional application of application Ser. No. 11/892,139 filed Aug. 20, 2007, now U.S. Pat. No. 8,093,616, and is based upon and claims the benefit of priority from the prior Japanese Patent Application No. 2006-322460, filed on Nov. 29, 2006, the entire contents of which are incorporated herein by reference.

BACKGROUND OF THE INVENTION

1. Field of the Invention

The present invention generally relates to electronic components, manufacturing methods of the electronic components, electronic component assembly bodies, and electronic devices, and more specifically, to an electronic component such as an LED (light emitting diode), a manufacturing method of the electronic component, an electronic component assembly body having the electronic component, and an electronic device having the electronic component assembly body.

2. Description of the Related Art

For example, as electronic components emitting light, light emitting components such as a LED (Light Emitting Diode) diode or a laser diode have become known. These electronic components are mounted on boards. Japanese Laid-Open Patent Application Publication No. 5-129711 describes a semiconductor laser device where a semiconductor laser chip is mounted. In this semiconductor laser device, laser light emanates from the semiconductor laser chip in a direction parallel (horizontal) with a surface direction of chip mount (board). In addition, the laser light emanating in this horizontal direction is converted at 45 degrees by a reflection mirror so as to irradiate in a direction perpendicular to the chip mount.

FIG. 1 is a perspective view of a first related art component mounting board. More specifically, in the example shown FIG. 1, a component mounting board 1A where an electronic component 3 is mounted on a board 2 is shown. The electronic component 3 includes a semiconductor laser chip 9 and leads 5. The leads 5 extend to sides of the semiconductor laser chip 9. Pads 4 are formed on a mounting position of the electronic component 3 of the board 2. The electronic component 3 is mounted on the board 2 by soldering the leads 5 to the pads 4. A light emitting surface 8A of the electronic component 3 faces upward and therefore the laser light is irradiated upward.

However, in the structure shown in FIG. 1 where the electronic component 3 is surface mounted on the board 2, a projecting amount shown by an arrow "h" in FIG. 1 from a board surface 2a of the board 2 of the electronic component 3 is high, so that thickness of the entire component mounting board 1A is large. While the projection height from the board surface 2a of the electronic component 3 is approximately several mm through several tens mm, in a case where the electronic component 3 is mounted on an electronic device such as a portable phone required to have small size and thickness, a dead space may be formed inside of the electronic device or interference with other components may be generated.

Because of this, as discussed in Japanese Laid-Open Patent Application Publication No. 8-186326, a structure where an opening is formed in a board and an electronic component is inserted in the opening at the time of mounting so that thickness of entire component mounting board can be made small has been suggested. FIG. 2 is a perspective view of a second related art component mounting board and shows such a mounting structure.

As shown in FIG. 2, an opening part 6 is formed in a board 2. Pads are formed in the vicinity of the opening part 6. The electronic component 3 is mounted on the board 2 in an inverted state where a light emitting surface 8A faces downward and a rear surface 8B faces upward. Under this structure, since the electronic component 3 is positioned in the opening part 6 and does not project from the surface of the board 2, it is possible to make the entire component mounting board 1B have small thickness.

However, in the mounting structure shown in FIG. 2 where the electronic component 3 is simply made up side down and inserted in the opening part 6, depending on the thickness of the board 2 where the electronic component 3 is mounted, problem discussed below may be generated.

FIG. 3 is a perspective view for explaining the problems of the example shown in FIG. 2. More specifically, FIG. 3(A) shows a component mounting board 1B having a thick board 2 where an electronic component 3 is mounted. FIG. 3(B) shows a component mounting board 1C having a thin board 2 where the electronic component 3 is mounted. The thickness D1 of the board 2 shown in FIG. 3(A) is greater than the thickness D2 of the board 2 shown in FIG. 3(B) (D1>D2).

In the case shown in FIG. 3(A) where the thickness D1 of the board 2 is large, namely the opening part 6 is deep, the light emitting surface 8A of the electronic component 3 is positioned at a deep point inside of the opening part 6 separated from the rear surface of the light emitting surface 8A. Therefore, even if light L1 is irradiated from a deep position of the opening part 6, the spread of the light L1 is blocked by an internal wall of the opening part 6 so as to be narrow.

On the other hand, in the case shown in FIG. 3(B) where the thickness D2 of the board 2 is small, namely the opening part 6 is shallow, the light emitting surface 8A of the electronic component 3 is positioned in the vicinity of the rear surface of the board 2. Therefore, in a case where light L2 is irradiated from a position in the vicinity of the rear surface of the board 2 of the opening part 6, the amount of the light L2 blocked by the opening part 6 is small and therefore the spread of the light L1 is wide.

More specifically, if the electronic components 3 are provided at the same heights in the examples shown in FIG. 3(A) and FIG. 3(B), the spread W1 (calculated as a diameter of irradiated light) of the light L1 in the example shown in FIG. 3(A) where the thickness of the board 2 is large is narrower than the spread W2 (calculated as a diameter of irradiated light) of the light L2 in the example shown in FIG. 3(B) where the thickness of the board 2 is small.

Thus, in the structure where irradiation characteristics of the light irradiated by the electronic component 3 are changed depending on the thickness of the board 2, since a light irradiation amount of the light emitting diode chip 9 is changed depending on a plate pressure of the board 2, it is not possible to obtain stable characteristics. In addition, it is necessary to change the characteristics of the light emitting diode chip 9 corresponding to the depth of the opening part 6 depending on the plate pressure of the board 2. Hence, in this case, a large amount of time, workload or cost may be required for change of setting.

SUMMARY OF THE INVENTION

Accordingly, embodiments of the present invention may provide a novel and useful electronic component, manufacturing method of the electronic component, electronic component assembly body, and electronic device solving one or more of the problems discussed above.

More specifically, the embodiments of the present invention may provide an electronic component which can realize stable driving regardless of thickness of a board, a manufacturing method of the electronic component, an electronic component assembly body, and an electronic device.

One aspect of the present invention may be to provide an electronic component, including a main body part inserted in an opening part formed in a board; and a pair of leads each of the leads having an end connected to the main body part and another end connected to a pad formed on the board; wherein the main body part is provided with the leads so that a functional surface of the main body part is positioned at a side connected to the pads of the board.

Another aspect of the present invention may be to provided a manufacturing method of an electronic component, including: a connection step of connecting one lead to a surface parallel with a pn connection layer of an electronic element having a structure where the p-type layer and the n-type layer are connected by the pn connection layer, by using a connection material, and of connecting another lead to another surface parallel with the pn connection layer of the electronic element by using a connection material; and a lead forming step of forming a supporting part connected to and supporting the electronic element and an electrode part functioning as an electrode, by bending the pair of the leads to an outside.

Other aspect of the present invention may be to provided a manufacturing method of an electronic component, including: a connection step of connecting one lead to a lower surface perpendicular to a pn connection layer of an electronic element having a structure where a p-type layer and an n-type layer are connected by the pn connection layer, by using a connection material, and of connecting another lead to another lower surface perpendicular to the pn connection layer of the n-type layer of the electronic element by using a connection material; and a lead forming step of forming a supporting part connected to and supporting the electronic element, an electrode part functioning as an electrode, and a connection part connecting the supporting part and the electrode part, by bending the pair of the leads to an outside.

According to the embodiment of the present invention, the main body part of the electronic component is provided to the leads so that the functional surface is positioned at the side connecting to the pads of the lead. Because of this, the position of the functional surface in the opening part can be situated in an optional position of the leads, regardless of the depth of the opening part. Therefore, in a case where the electronic component is mounted on the board, it is possible to obtain stable characteristics not depending on the thickness of the board.

Other objects, features, and advantages of the present invention will be come more apparent from the following detailed description when read in conjunction with the accompanying drawings.

BRIEF DESCRIPTION OF THE DRAWINGS

FIG. 15 is a perspective view of a portable phone using the component mounting board of the first embodiment of the present invention and its manufacturing method.

DETAILED DESCRIPTION OF THE PREFERRED EMBODIMENTS

A description is given below, with reference to the FIG. 4 through FIG. 15 of embodiments of the present invention.

Figure 4:
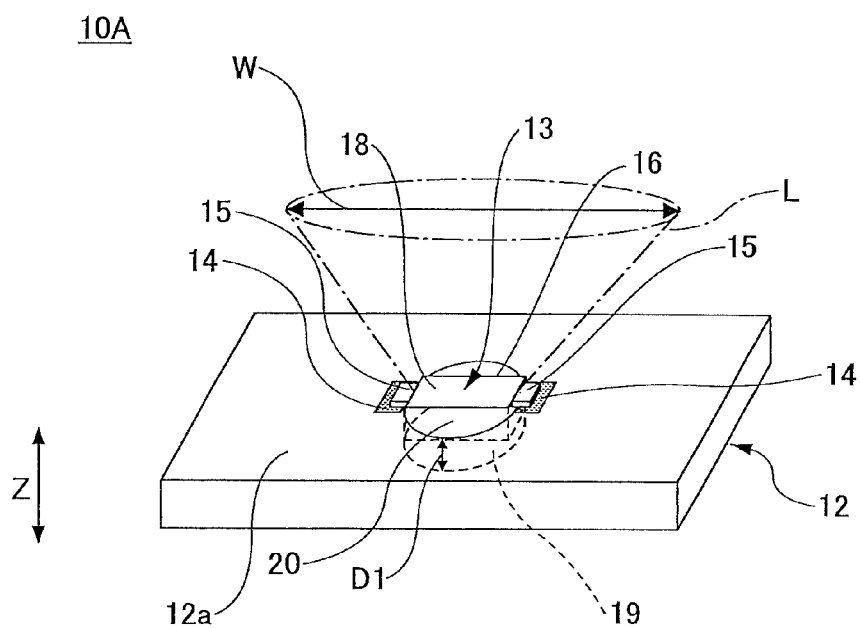
FIG. 4 is a perspective view of a component mounting board of a first embodiment of the present invention.
Figure 5:
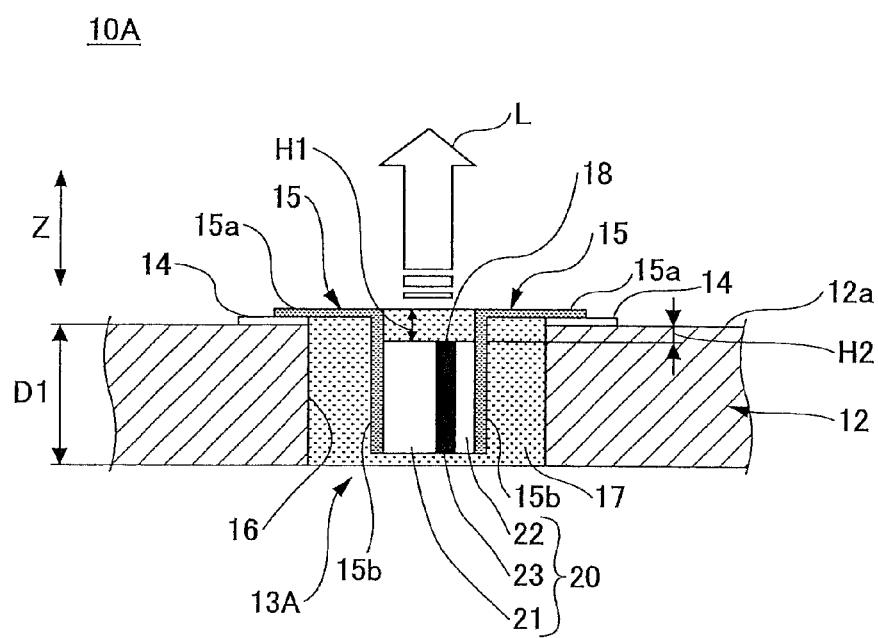
FIG. 5 is a cross-sectional view of the component mounting board of the first embodiment of the present invention.
Figure 6:
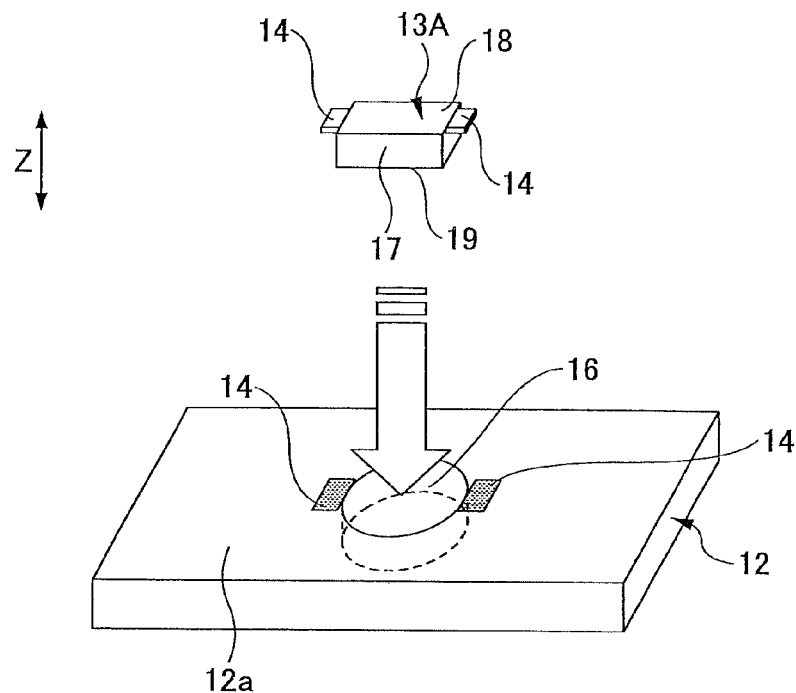
FIG. 6 is a perspective view for explaining a manufacturing method of the component mounting board of the first embodiment of the present invention.
Figure 7:
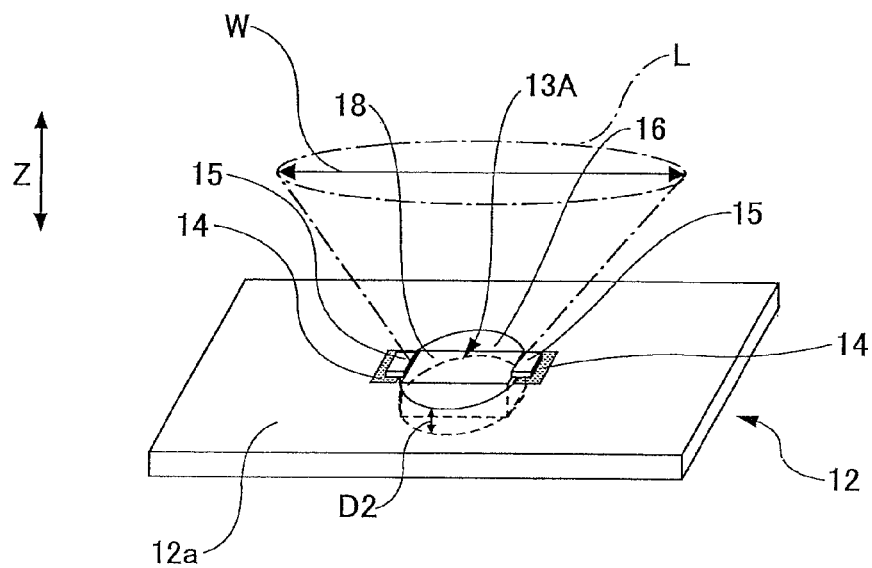
FIG. 7 is a perspective view for explaining an effect of the component mounting board of the first embodiment of the present invention.

FIG. 4 is a perspective view of a component mounting board of a first embodiment of the present invention. FIG. 5 is a cross-sectional view of the component mounting board of the first embodiment of the present invention. FIG. 6 is a perspective view for explaining a manufacturing method of the component mounting board of the first embodiment of the present invention. FIG. 7 is a perspective view for explaining an effect of the component mounting board of the first embodiment of the present invention.

In this embodiment, an example where a light emitting diode 13A is used as an electronic component and a component mounting board 10A where the light emitting diode 13A is mounted on a board 12 is used as an electronic component assembly body is discussed.

First, structures of the light emitting diode 13A and the component mounting board 10A are discussed with reference to FIG. 4 and FIG. 5.

The light emitting diode 13A includes a pair of leads 15, transparent resin 17, a light emitting diode chip 20 as a main body part, and others.

The leads 15 are made of copper or lead frame materials. The leads 15 are formed by bending so as to have substantially L-shaped configurations. The lead 15 includes an electrode part 15a and a supporting part 15b. In a state where the light emitting diode 13A is mounted on the board 12, the electrode part 15a is connected to the pad 14 formed on the board 12 by soldering.

On the other hand, a supporting part 15b of one lead 15 is physically and electrically connected to a p-type layer 22 of the light emitting diode chip 20. A supporting part 15b of another lead 15 is physically and electrically connected to an n-type layer 21 of the light emitting diode chip 20. Furthermore, in the lead 15, the supporting part 15b extends parallel to a pn connection layer 23 of the light emitting diode chip 20.

An edge part at a functional surface side discussed below of this supporting part 15b is bent outside so that the electrode part 15a connected to the pad 14 is formed.

The light emitting diode chip 20 is sandwiched by the pair of the leads 15. The light emitting diode chip 20 includes the n-type layer 21, the p-type layer 22, and the connection layer 23. By a forward current flowing between the n-type layer 21 and the p-type layer 22, a minority carrier is provided in the connection layer 23 so that light is emitted when the minority carrier is reconnected to a majority carrier. In actual practice, light emitted by the light emitting diode chip 20 is irradiated from an upper end part of the connection layer 23. In the following description, a surface where light is emitted of the light emitting diode chip 20 is called the light emitting surface 18 or the functional surface.

The supporting part 15b of the lead 15 is parallel with the connection layer 23 of the light emitting diode chip 20. In addition, the connection layer 23 extends in a Z direction perpendicular to a board surface 12a.

The transparent resin 17 is, for example, epoxy group resin and seals, at least, the light emitting diode chip 20. In this embodiment, the transparent resin 17 seals the light emitting diode chip 20 and the supporting parts 15b. The transparent resin 17 is formed so as to correspond to the configuration of the opening part 16 formed in the board 12.

Accordingly, as shown in FIG. 6, when the light emitting diode 13A is mounted on the board 12, by inserting the transparent resin 17 into the opening part 16, the light emitting diode chip 20 is positioned in a designated position in the opening part 16. Furthermore, the leads 15 (the electrode parts 15a) come in contact with the corresponding pads 14 and this contact position is fixed by soldering so that the light emitting diode 13A is physically and electrically connected to the board 12.

Details of the light emitting surface 18 of the light emitting diode chip 20 are discussed. The light emitting surface 18 functions as a functional surface of the light emitting diode chip 20. The light is irradiated from this light emitting surface 18. This irradiation light is actually irradiated from the connection layer 23 to the outside.

In this embodiment, the light emitting diode chip 20 is provided with the leads 15 so that the light emitting surface 18 as the functional surface is positioned at a side connected to the pads 14 of the leads 15. More specifically, the light emitting diode chip 20 is provided with the leads 15 so that the light emitting surface 18 close to the electrode parts 15a.

Figure 1:
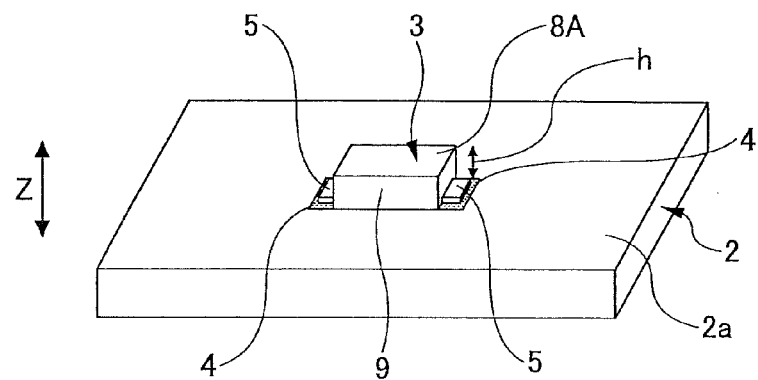
FIG. 1 is a perspective view of a first related art component mounting board.
Figure 2:
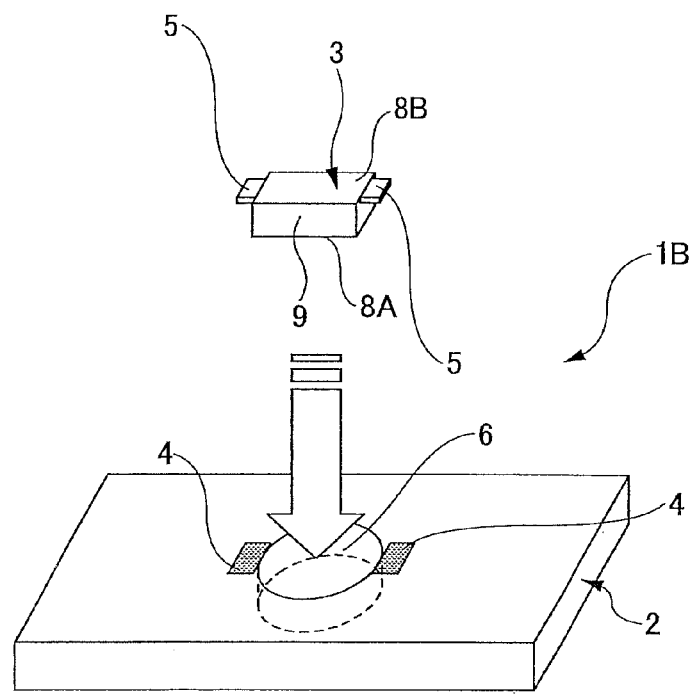
FIG. 2 is a perspective view of a second related art component mounting board.
Figure 3:
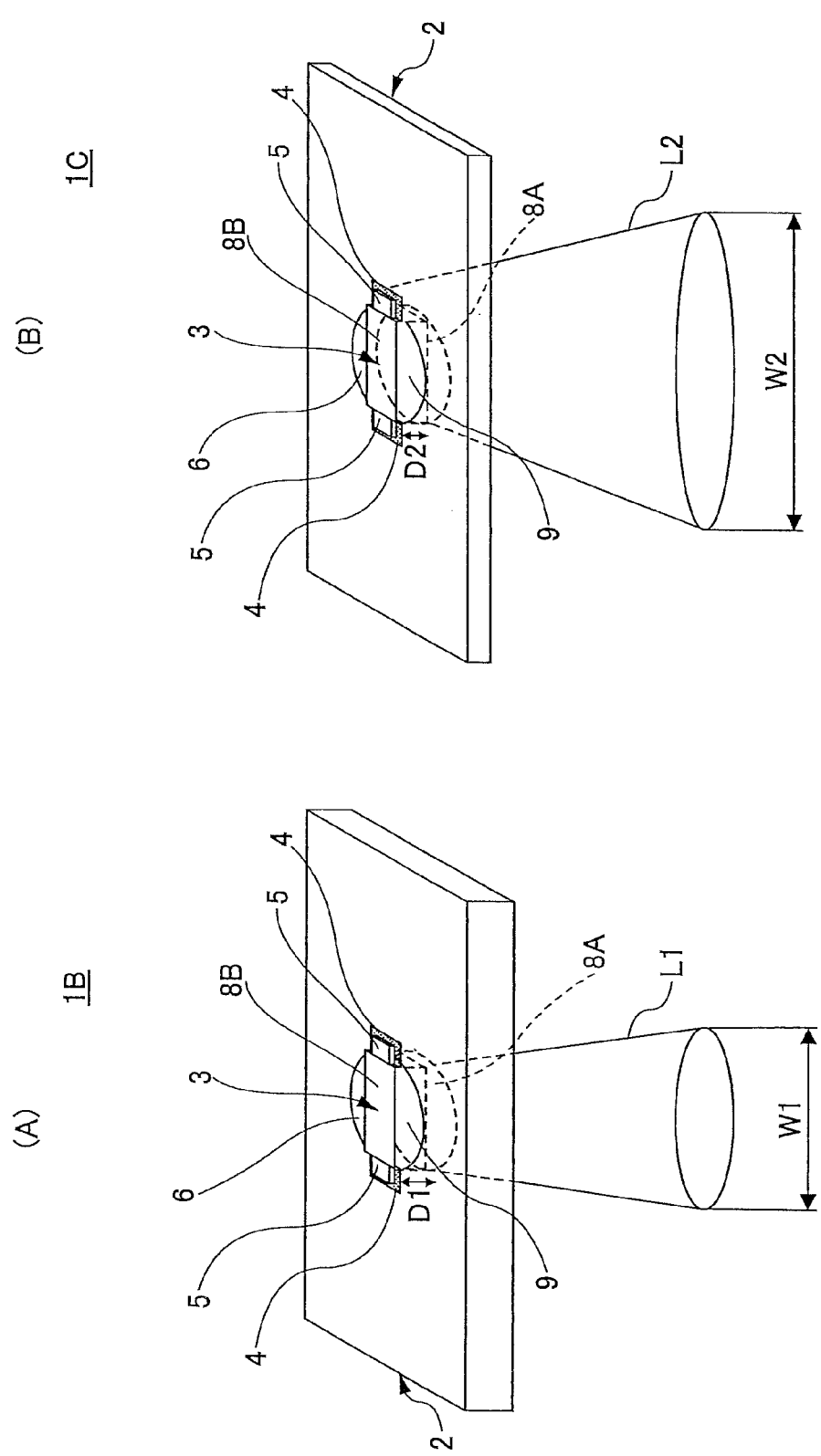
FIG. 3 is a perspective view for explaining problems of the example shown in FIG. 2.

Under this structure, the light irradiated from the light emitting surface 18 of the light emitting diode chip 20 is, as shown by an arrow in FIG. 5, irradiated in an upper direction perpendicular to the board surface 12a. This irradiation direction is opposite to the related art irradiation direction shown in FIG. 3.

Here, the reasons for influence on the emanation pattern of the light L irradiated from the light emitting surface 18 as the functional surface are discussed.

First, the relationship between the thickness D1 of the board 12 and the emanation pattern of the light L irradiated from the light emitting surface 18 is discussed.

In this embodiment, the light emitting surface 18 of the light emitting diode chip 20 is positioned in the vicinity of the electrode part 15a. Therefore, even if the thickness of the board 12 is changed, the distance between the board surface 12a and the light emitting surface 18 of the light emitting diode chip 20, shown by an arrow H2 in FIG. 5, is always constant. In other words, the distance H2 between the board surface 12a and the light emitting surface 18 is not influenced by the thickness D1 of the board 12.

Therefore, even if the light emitting diode 13A is mounted on the board 12 having less thickness D2 than the thickness D1 (D2<D1) instead of the board having the thickness D1 as shown in FIG. 4 and FIG. 5, the spread W of the light L irradiated from the light emitting diode 13A is the same as that of the example shown in FIG. 4 and FIG. 5. Thus, in this embodiment, regardless of the thickness of the board, it is possible to stabilize the characteristics of the light L irradiated from the light emitting diode 13A.

Next, the relationship between the distance shown by an arrow H1 in FIG. 5 between the electrode parts 15a and the light emitting surface 18 and the emanation pattern of the light L irradiated from the light emitting surface 18 is discussed. As discussed above, the light emitting diode chip 20 is sandwiched by the pair of the leads 15 and the electrode parts 15a may be bent against the light emitting surface 18. Therefore, the distance H1 between the electrode part 15a and the light emitting surface 18 influences the emanation pattern of the light L irradiated from the light emitting surface 18.

More specifically, as the distance H1 becomes smaller, a shading effect of the leads 15 on the light L irradiated from the light emitting surface 18 becomes lower. Therefore, it is possible to make the irradiation range of the light L wide. As the distance H1 becomes greater, the shading effect of the leads 15 on the light L irradiated from the light emitting surface 18 becomes higher. Therefore, the irradiation range of the light L is narrow. Thus, characteristics of the light L irradiated from the light emitting surface 18 can be adjusted by changing the distance H1 between the electrode parts 15a and the light emitting surface 18.

In addition, as discussed above, the distance H1 can be adjusted by changing the bending position of the electrode parts 15a against the supporting parts 15b. Therefore, by making a structure where the leads 15 can be bent at a different bending position, it is possible to adjust the characteristics of the light L irradiated from the mounting board 10A outside.

In order to bend the leads 15 at the bending position, for example, a bendable material may be selected as a material of the is leads 15 or the leads 15 may have a bendable cross-sectional configuration.

Figure 8:
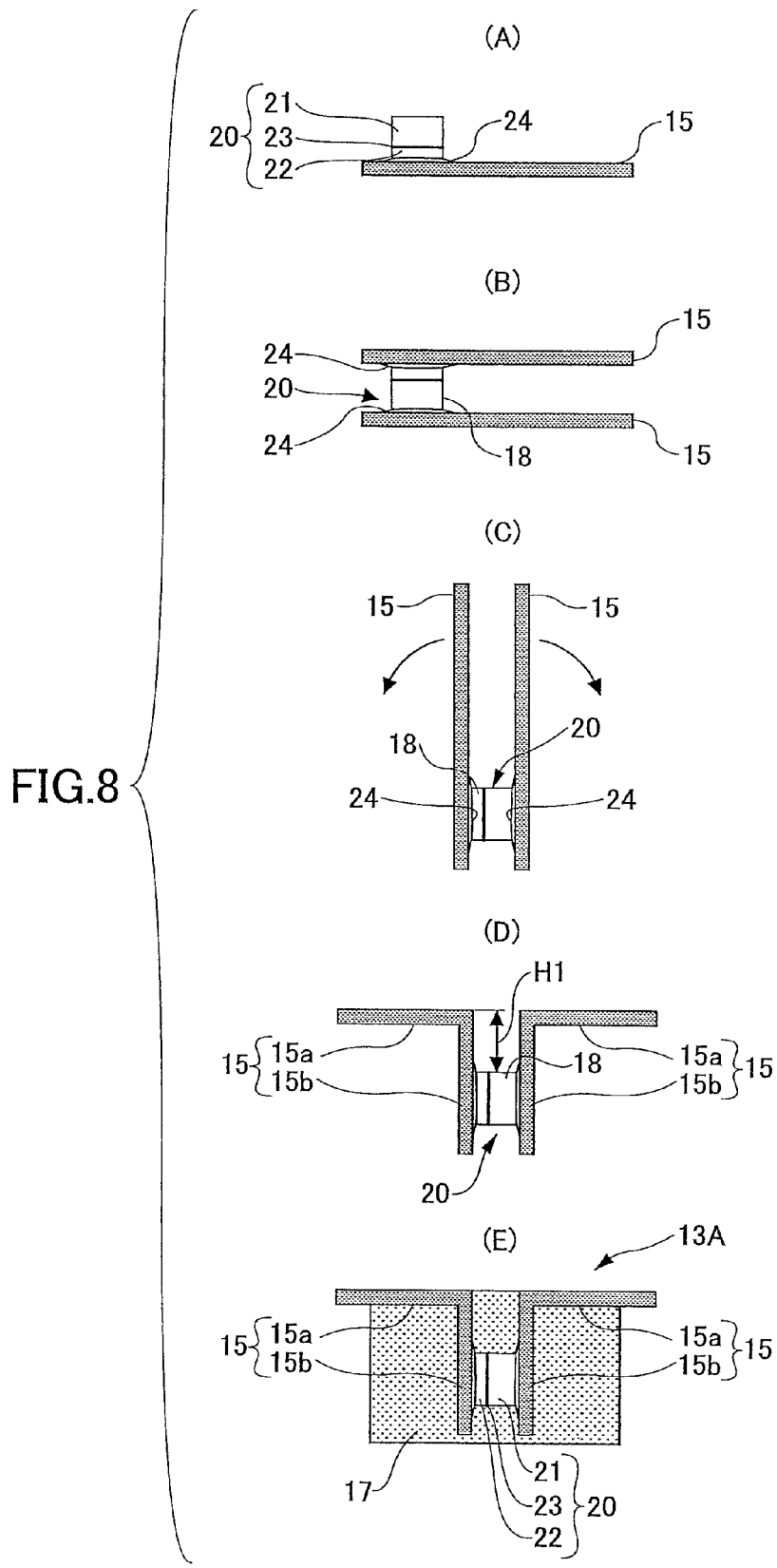
FIG. 8 is a cross-sectional view showing a manufacturing method of a LED (Light Emitting Diode) used for the first embodiment of the present invention.

Next, a manufacturing method of the light emitting diode 13A is discussed with reference to FIG. 8. FIG. 8 is a cross-sectional view showing a manufacturing method of the light emitting diode 13A used for the first embodiment of the present invention.

In order to manufacture the light emitting diode 13A, first, the first lead 15 is connected to the light emitting diode chip 20. As discussed above, the light emitting diode chip 20 is made of the n-type layer 21, the p-type layer 22, and the connection layer 23. The first lead 15 is connected to the n-type layer 21 or the p-type layer 22 (a first connection step). In this embodiment, as shown in FIG. 8(A), the first lead 15 is connected to the p-type layer 22 by using solder 24.

Next, as shown in FIG. 8(B), the second lead 15 is connected to the n-type layer 21 by using solder 24 (a second connection step).

At this time, a connection surface where each of the leads 15 of the light emitting diode chip 20 is connected is selected as a surface parallel with the connection layer 23. Because of this, each of the leads 15 is parallel with the connection layer 23 in a state where the pair of the leads 15 is connected to the light emitting diode chip 20.

For connecting the pair of the leads 15 to the light emitting diode 20, the above-discussed first and second connection steps may be implemented in a lump by applying a reflow process in a state where solder paste is applied on the surface of the leads 15 where the light emitting diode chip 20 is connected in advance so that the light emitting diode chip 20 is provisionally connected between the pair of the leads 15.

After the pair of the leads 15 is connected to the light emitting diode chip 20 so that the pair of the leads 15 sandwiches the light emitting diode chip 20 and is parallel with the connection layer 23, the electrode parts 15a and the supporting parts 15b are formed by bending the leads 15 to the outside, namely in a direction indicated by an arrow in FIG. 8(C) (lead forming step). This forming process of the leads 15 can be easily implemented by using an existing lead frame forming device.

FIG. 8(D) shows a state where the lead 15 are bent so that the electrode parts 15a and the supporting part 15b are formed. The distance indicated by an arrow H1 in FIG. 8(D) between the light emitting surface 18 of the light emitting diode chip 20 and the electrode parts 15a can be optionally set by properly selecting a bending position of the leads 15.

This distance H1 is equivalent to the distance H1 between the electrode parts 15a and the light emitting surface 18. Therefore, the distance H1 between the electrode parts 15a and the light emitting surface 18, which influences the emanation pattern of the light L irradiated from the light emitting surface (functional surface) 18 can be adjusted by adjusting the bending position of the lead 15 in the lead forming step.

In addition, the electrode parts 15a require a designated length so that the reliability of electric connections can be maintained. Therefore, in order to optionally adjust the distance H1, properly adjusting the length of the leads 15 themselves, in addition to adjusting the bending position, is important.

After the bending process for the leads 15 is completed, a forming process of transparent resin 17 as an exterior member is implemented (exterior member forming step). FIG. 8(E) shows a state where the transparent resin 17 is formed so that the light emitting diode 13A is manufactured.

As discussed above, epoxy group resin, for example, can be used as a material of the transparent resin 17 and a transfer molding method can be applied as a molding method. The transfer mold method is generally used as a sealing method of a semiconductor device. Therefore, by this method, it is possible to easily seal the light emitting diode chip 20 with the transparent resin 17 at low cost. While the sealing process is applied to all parts other than a part of the electrode parts 15a by the transparent resin 17 in this example, it is sufficient to form the transparent resin 17 in a range where at least the light emitting diode chip 20 is sealed.

Meanwhile, FIG. 9 through FIG. 14 shows component mounting boards 10B through 10F as other examples of the above-discussed component mounting board 10A. In these component mounting boards 10B through 10F, the light emitting diode chip 20 is provided with the lead 15 so that the light emitting surface 18 as the functional surface is positioned at a side connecting to the pad 14 of the leads 15, 25 and 26. In addition, the connection layer 23 extends in a Z direction perpendicular to a board surface 12a in a state where the light emitting diode chip 20 is mounted on the board 12.

In FIG. 9 through FIG. 14, parts that are the same as the parts of the component mounting board 10A of the first embodiment of the present invention shown in FIG. 4 through FIG. 8 are given the same reference numerals, and explanation thereof is partially omitted.

Figure 9:
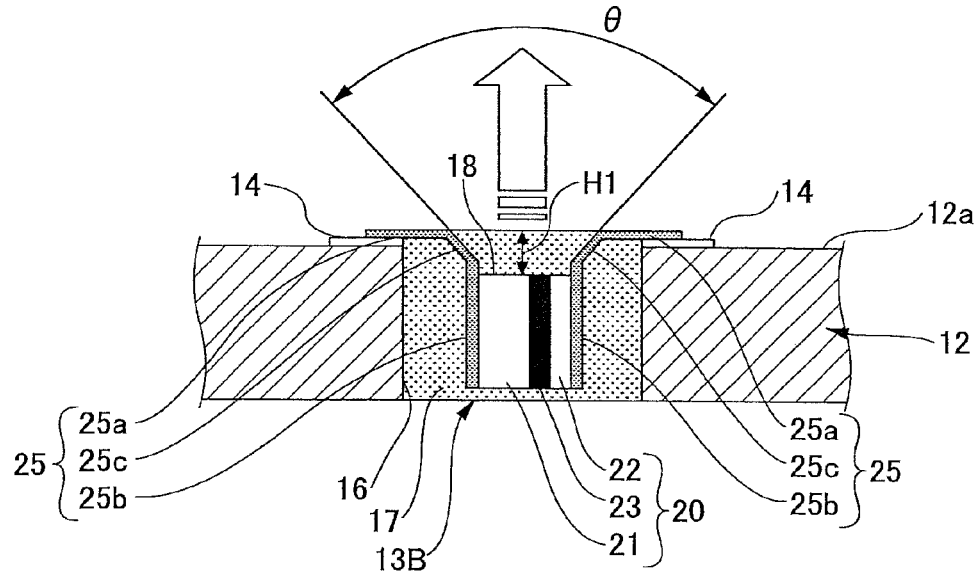
FIG. 9 is a cross-sectional view of a component mounting board of a second embodiment of the present invention.

FIG. 9 is a cross-sectional view of a component mounting board 10B of a second embodiment of the present invention. In the above-discussed first embodiment of the present invention, the light emitting diode 13A forming the component mounting board 10A has the structure where the leads 15 are bent at right angle so that the electrode parts 15a and the supporting parts 15b are formed.

On the other hand, in the second embodiment of the present invention, a light emitting diode 13B forming the component mounting board 10B has a structure where a lead 25 is formed by an electrode part 25a, a supporting board 25b and an inclination part 25c. The inclination part 25c is formed by the lead forming step for the lead 15. The inclination part 25c is formed at the same time when the electrode part 25a and the supporting part 25b. The electrode part 25a of this embodiment corresponds to the electrode part 15a of the first embodiment and the supporting part 25b of this embodiment corresponds to the supporting part 15b of the first embodiment.

As discussed above, the distance H1 between the electrode part 15a and the light emitting surface 18 influences the emanation pattern of the light L irradiated from the light emitting surface (functional surface) 18. However, in a case such as this embodiment where the inclination parts 25c are provided between the electrode part 25a and the supporting parts 25b, these inclination parts 25c influences the emanation pattern of the light L irradiated from the light emitting surface (functional surface) 18.

More specifically, since the shading effect of the leads 25 on the light L irradiated from the light emitting surface 18 having a large angle indicated by an arrow θ in FIG. 9 and formed by the pair of the inclination parts 25c is low, it is possible to widen the irradiation range of the light L. If the angle θ formed by the pair of the inclination parts 25c becomes small, the shading effect of the leads 25 on the light L irradiated from the light emitting surface 18 is increased so that the irradiation range of the light L becomes narrow.

Thus, the characteristics of the light L irradiated from the light emitting surface 18 can be adjusted by the angle θ formed by the pair of the inclination parts 25c. Therefore, according the structure of the component mounting board 10B of this embodiment, adjustment of the angle θ formed by the pair of the inclination parts 25c, in addition to the adjustment of the distance H1 between the electrode parts 25a and the light emitting surface 18, is made so that the characteristics of the light L irradiated from the component mounting board 10B to outside can be adjusted.

Figure 10:
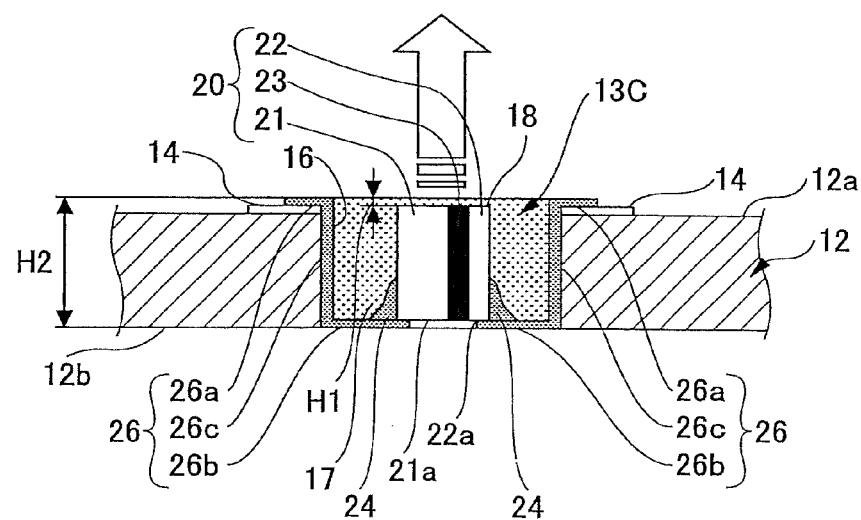
FIG. 10 is a cross-sectional view of a component mounting board of a third embodiment of the present invention.

FIG. 10 is a cross-sectional view of a component mounting board 100 of a third embodiment of the present invention. In the third embodiment of the present invention, a light emitting diode 13B provided on the component mounting board 100 has a structure where a lead 26 is formed by an electrode part 26a, a supporting board 26b and a connection part 26c. The electrode part 26a, the supporting board 26b and the connection part 26c are formed by the lead forming step for the lead 15. The electrode part 65a of this embodiment corresponds to the electrode part 15a of the first embodiment.

The supporting part 26b of one of the leads 26 is connected to a bottom surface 21a extending in a direction perpendicular to the connection layer 23 of the n-type layer 21 by the solder 24. The connection part 26c of another lead 26 is connected to a bottom surface 22a extending in a direction perpendicular to the connection layer 23 of the p-type layer 22 by the solder 24. Thus, the lead 26 is supported from the bottom surface part of the light emitting diode chip 20.

In addition, the connection part 26c connects the electrode part 26a and the supporting part 26b. The connection part 26c extends in parallel with the connection layer 23 of this embodiment and corresponds to an internal wall configuration of the opening part 16. In a state where the light emitting diode 13C is mounted (inserted) in the opening part 16 formed in the board 12, the supporting part 26b forms the same surface of the bottom surface 12b of the board 12. In addition, the connection part 26c extending in parallel with the connection layer 23 comes in contact with the internal wall of the opening part 16.

Under this structure, the light emitting diode 13C directly supports a bottom surface part (bottom surfaces 21a, 22a) of the light emitting diode chip 20 by the supporting part 26b. Because of this, the transparent resin 17 is not provided on the bottom surface part of the light emitting diode chip 20. In addition, the distance H1 between the light emitting surface 18 and the electrode parts 26a is set to be a minimum distance sufficient to protect the light emitting diode chip 20.

Accordingly, it is possible to make the height indicated by an arrow H2 in FIG. 10 of the light emitting diode 13C small. Furthermore, since the supporting part 26b forms the same surface as the bottom surface 12b of the board 12 in this embodiment, it is possible to make the thickness of the board 12 substantially equal to the height H2 of the light emitting diode 13C, so that it is possible to make the component mounting board 100 have low height.

Figure 11:
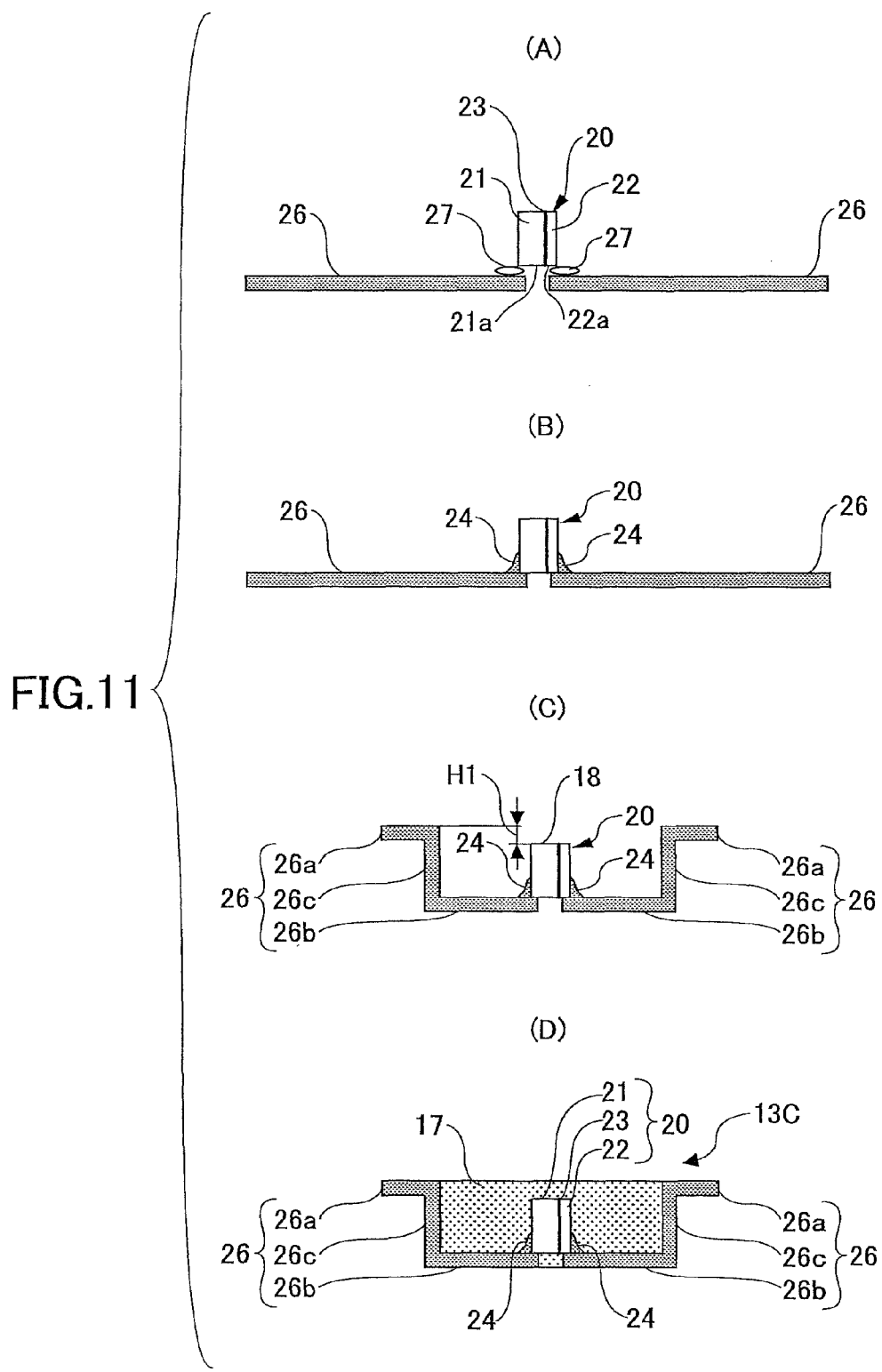
FIG. 11 is a cross-sectional view for explaining a manufacturing method of a (Light Emitting Diode) used for the third embodiment of the present invention.

Next, a manufacturing method of the light emitting diode 13C is discussed with reference to FIG. 11. Here, FIG. 11 is a cross-sectional view for explaining the manufacturing method of the light emitting diode 13C used for the third embodiment of the present invention.

In order to manufacture the light emitting diode 13C, first, the pair of the leads 26 is connected to the light emitting diode chip 20. More specifically, the bottom surface 21a extending in a direction perpendicular to the connection layer 23 of the n-type layer 21 and one of the leads 26 are provisionally connected to each other by a solder paste 27. The bottom surface 22a extending in a direction perpendicular to the connection layer 23 of the p-type layer 22 and another lead 26 are provisionally connected to each other by a solder paste 27. FIG. 11(A) shows a state where the light emitting diode chip 20 is provisionally connected to each of the leads 26 by the solder paste 27.

The leads 26 where the light emitting diode chip 20 is provisionally connected are provided in a reflow oven and heated so that the light emitting diode chip 20 is connected to the leads 26 by the solder 24. FIG. 11(B) shows a state where the light emitting diode chip 20 is connected to the lead 26. As a result of this, the leads 26 support the light emitting diode chip 20 from the bottom surface part.

Next, the leads 26 are bent so that the electrode parts 26a, the supporting parts 26b, and the connection parts 26c are formed (lead forming step). The forming process of the leads 26 can be easily implemented by using the existing lead frame forming device.

FIG. 11(D) shows a state where the leads 26 are bent so that the electrode parts 26a, the supporting parts 26b, and the connection parts 26c are formed. The distance indicated by an arrow H1 in FIG. 11(C) between the light emitting surface 18 of the light emitting diode chip 20 and the electrode parts 26a can be optionally set by properly adjusting the bending position of the leads 16.

As discussed above, the distance H1 influences the emanation pattern of the light L irradiated from the light emitting surface (functional surface) 18. In this embodiment, by adjusting the bending position of the electrode parts 26a against the connection parts 26c, it is possible to adjust the distance H1 between the electrode parts 26a and the light emitting surface 18 so that the characteristics of the light irradiated from the light emitting diode 13C can be adjusted.

After the bending process of the leads 26 is completed, a forming process of the transparent resin 17 as an external member is implemented (external member forming step). FIG. 11(D) shows a state where the transparent resin 17 is formed so that the light emitting diode 13C is manufactured. In this embodiment, the transparent resin 17 is formed only at the inside of the connection part 26c. As discussed above, the light emitting diode 13C having low height can be easily manufactured by the same step as the manufacturing method for the light emitting diode 13A discussed above with reference to FIG. 8.

Figure 12:
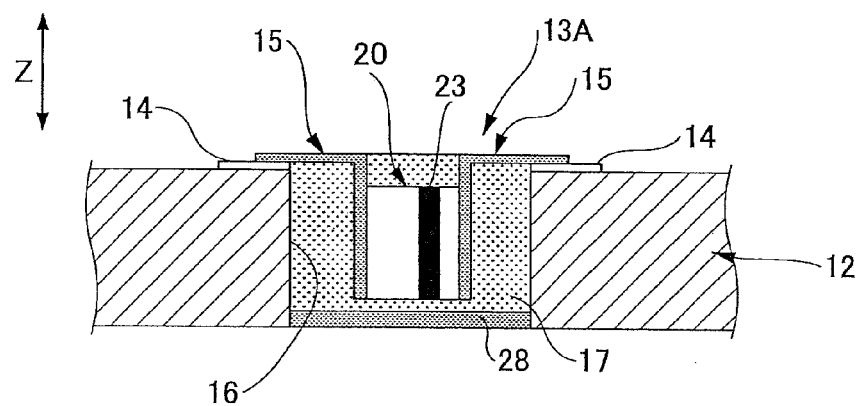
FIG. 12 is a cross-sectional view of a component mounting board of a fourth embodiment of the present invention.

FIG. 12 is a cross-sectional view of a component mounting board 10D of a fourth embodiment of the present invention. In the fourth embodiment of the present invention, while the component mounting board 10D has the same structure as the component mounting boards 10A shown in FIG. 4 and FIG. 5, a shade plate 28 is provided on the bottom surface of the transparent resin 17 forming the light emitting diode 13A.

In the above-discussed component mounting board 10A of the first embodiment of the present invention, nothing is provided on the bottom surface of the transparent resin 17. On the other hand, the light irradiated from the light emitting diode chip 20 emanates in a radiated manner so that a part of the light emanates into the transparent resin 17 and is diffused. This light is called diffuse light. This diffuse light, in a structure of the first embodiment of the present invention where nothing is provided on the bottom surface of the transparent resin 17, comes out downward from the bottom surface of the transparent resin 17.

In the meantime, in an electronic device such as a portable phone (see FIG. 15) where the component mounting board 10D is provided, an electronic component experiencing an error operation due to the light may be provided in the vicinity of the light emitting diode 13A. In this case, due to the diffuse light leaking out from the light emitting diode 13A, the error operation of the electronic component may occur.

On the other hand, in the component mounting board 10D of this embodiment, since the shade plate 28 is formed on the bottom part of the transparent resin 17 forming the light emitting diode 13A, it is possible to prevent the diffuse light from coming out from the bottom part of the transparent resin 17. As a result of this, even if an electronic component whose the error operation may happen due to the light is provided in the vicinity of the light emitting diode 13A, it is possible to prevent the error operation of the electronic component and reliability of the electronic device where the component mounting board 10D is provided can be improved.

As a detailed structure of the shade plate 28, a printed wiring board or a board having a low permeability of other light may be provided. In addition, an application having a shading function may be applied or a metal film having a shading function may be formed.

Figure 13:
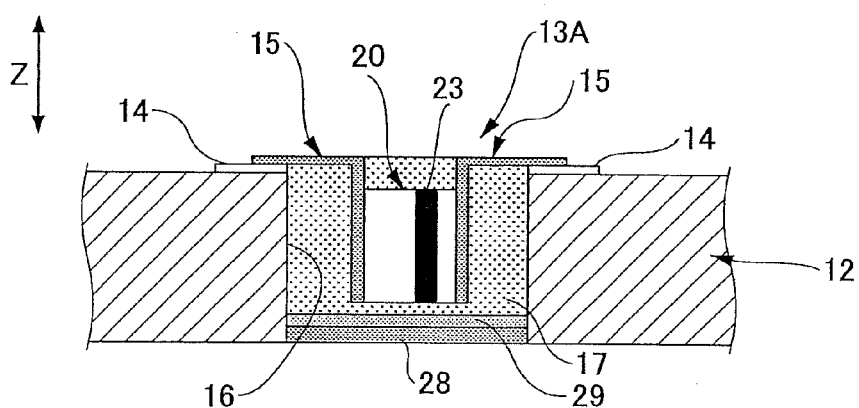
FIG. 13 is a cross-sectional view of a component mounting board of a fifth embodiment of the present invention.

FIG. 13 is a cross-sectional view of a component mounting board 10E of a fifth embodiment of the present invention. In the component mounting board 10E of the fifth embodiment of the present invention having the substantially same structure as that of the component mounting boards 10A shown in FIG. 4 and FIG. 5, a reflection plate 20 is provided on the bottom surface of the transparent resin 17 forming the light emitting diode 13A.

As discussed above, a part of the light irradiated from the light emitting surface 18 emanates in the transparent resin 17 as the diffuse light. In the component mounting board 10D of the fourth embodiment of the present invention, the shading plate 28 is provided on the bottom part of the transparent resin 17 so that this diffuse light is prevented from leaking out from the bottom part.

On the other hand, in this embodiment, the reflection plate 29 is provided on the bottom part of the transparent resin 17 so that the diffuse light emanating into the bottom part of the transparent resin 17 is reflected to an upper surface of the transparent resin 17. Under this structure, since the diffuse light as well as the light irradiated from the light emitting diode 13A is irradiated upward, loss of light generated by the light emitting diode chip 20 can be reduced.

As a detailed structure of the reflection plate 29, a mirror may be provided; a metal film having a high reflection rate may be formed; or a silver paste may be provided. In an example shown in FIG. 13, a silver paste is provided on a surface of the shading plate 28 facing the bottom part of the transparent resin 17.

Figure 14:
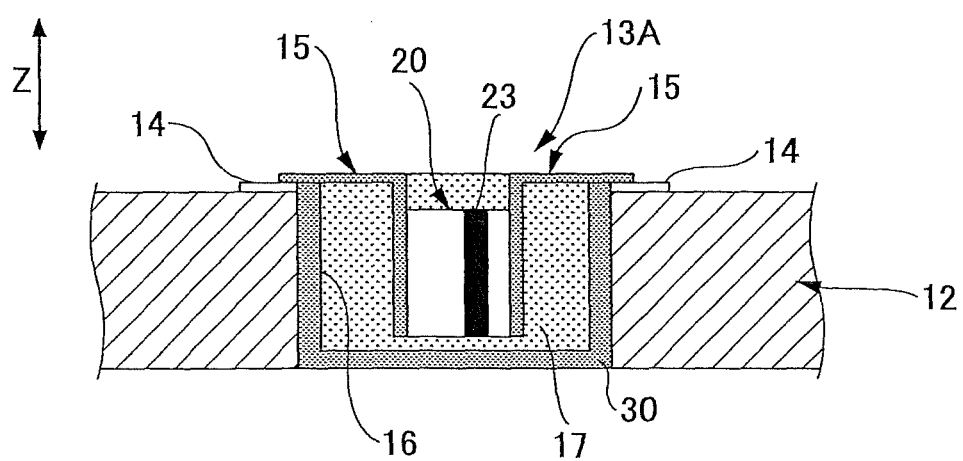
FIG. 14 is a cross-sectional view of a component mounting board of a sixth embodiment of the present invention.

FIG. 14 is a cross-sectional view of a component mounting board 10F of a sixth embodiment of the present invention. In the component mounting board 10D of the fourth embodiment of the present shown in FIG. 12, the shading plate 28 having the shading function is provided at only the bottom part of the transparent resin 17. However, in the present invention, a position of a member having the shading function is not limited to the bottom part of the transparent resin 17 and may be another portion such as a side surface of the transparent resin 17.

In the light emitting diode 13A provided at the component mounting board 10F of this embodiment, a shading case 30 having a cylindrical shape configuration and a bottom is used. The transparent resin 17 is provided in the shading case 30. Under this structure, it is possible to securely prevent the diffuse light from coming to the outside from a surface other than an upper surface of the transparent resin 17 where the light coming out from the light emitting surface 18 is properly irradiated to the outside. The shading case 30 may be formed by metal or resin.

FIG. 15 shows an example where the above-discussed component mounting board 10A is applied to a portable phone 35 as an electronic device. While the component mounting board 10A is applied to the portable phone 35 in this example, other component mounting boards 10B through 10F can be applied to the portable phone 35.

As shown in FIG. 15(A), in the component mounting board 10A, plural light emitting diodes 13A are provided on the board 12. FIG. 15(B) shows a membrane switch 31 provided in the portable phone 35. This membrane switch has a structure where a transparent spacer is provided between a pair of transparent film electrodes. Plural switch parts 32 are formed in the membrane switch 31. By pushing a switch part 32, the switch part 32 is turned ON.

The light emitting diode 13A provided in the component mounting board 10A and the switch parts 32 provided in the membrane switch 31 are provided in positions corresponding to operations keys 36 provided in the potable phone 35. See FIG. 15(C).

When the component mounting board 10A and the membrane switch 31 are assembled in the potable phone 35, the switch parts 32 are provided on the upper part of the component mounting board 10A and this is installed in the potable phone 35. The operations key 36 transmits light.

Therefore, when the light emitting diode 13A irradiates light from the light emitting surface 18, this light passes through the membrane switch 31 made of a transparent material so as to irradiate the operations keys 36. As discussed above, since the operations keys 36 transmit the light, the light of the light emitting diode 13A can be recognized by eyes of an operator of the portable phone 35 via the operations keys 36. Because of this, it is possible to improve operability of the portable phone 35, more specifically operability in a dark place.

Since the light emitting diode 13A (through 13F) of the embodiment of the present invention has low height, it is possible to make the size of the portable phone 35 where the light emitting diode 13A (through 13F) of the embodiment of the present invention is applied small.

The present invention is not limited to these embodiments, but variations and modifications may be made without departing from the scope of the present invention.

What is claimed is:

1. A manufacturing method of an electronic component, comprising:
    connecting one lead of a pair of leads to a surface parallel with a pn connection layer of an electronic element having a structure where a p-type layer and a n-type layer are connected by the pn connection layer provided between the p-type layer and the n-type layer, by using a connection material, and of connecting another lead to another surface parallel with the pn connection layer of the electronic element by using a connection material;
    forming a supporting part of the pair of the leads, the supporting part being connected to and supporting the electronic element, and an electrode part functioning as an electrode, by bending the pair of the leads to an outside; and
    sealing the electronic element and parts of the leads inside a light transparent external member after forming the supporting part, so that a part of a top surface of the light transparent external member is flush with a top surface of the another lead,
    wherein each of the pair of leads is parallel to the pn connection layer of the electronic element.

* * * * *